US010443128B2

(12) United States Patent
Birtcher et al.

(10) Patent No.: US 10,443,128 B2
(45) Date of Patent: Oct. 15, 2019

(54) VESSEL AND METHOD FOR DELIVERY OF PRECURSOR MATERIALS

(71) Applicant: Air Products and Chemicals, Inc., Allentown, PA (US)

(72) Inventors: Charles Michael Birtcher, Valley Center, CA (US); Thomas Andrew Steidl, Escondido, CA (US); Sergei Vladimirovich Ivanov, Schnecksville, PA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 175 days.

(21) Appl. No.: 15/094,551

(22) Filed: Apr. 8, 2016

(65) Prior Publication Data

US 2016/0305019 A1  Oct. 20, 2016

Related U.S. Application Data

(60) Provisional application No. 62/149,548, filed on Apr. 18, 2015.

(51) Int. Cl.
*C23C 16/448*  (2006.01)
*C23C 16/455*  (2006.01)

(52) U.S. Cl.
CPC ...... *C23C 16/4481* (2013.01); *C23C 16/4482* (2013.01); *C23C 16/45561* (2013.01)

(58) Field of Classification Search
CPC .......... C23C 16/4481; C23C 16/45561; B67D 7/0272
See application file for complete search history.

(56) References Cited

U.S. PATENT DOCUMENTS

| 3,993,094 | A | * | 11/1976 | Spooner | .................... F15B 1/26 137/574 |
|---|---|---|---|---|---|
| 4,915,880 | A | | 4/1990 | Jenkins et al. | |
| 5,078,922 | A | | 1/1992 | Collins et al. | |
| 6,270,839 | B1 | | 8/2001 | Onoe et al. | |
| 6,424,800 | B1 | | 7/2002 | Kim | |
| 6,444,038 | B1 | | 9/2002 | Rangarajan et al. | |
| 6,698,728 | B1 | | 3/2004 | Ravetz et al. | |
| 6,915,592 | B2 | | 7/2005 | Guenther | |
| 7,077,388 | B2 | | 7/2006 | Stamp et al. | |
| 7,370,848 | B2 | | 5/2008 | Stamp et al. | |

(Continued)

FOREIGN PATENT DOCUMENTS

| JP | 05335243 A | 12/1993 |
|---|---|---|
| JP | 06267852 A | 9/1994 |

(Continued)

*Primary Examiner* — Kevin F Murphy
(74) *Attorney, Agent, or Firm* — Lina Yang

(57) ABSTRACT

A vessel for conveying a precursor-containing fluid stream from a precursor material contained within the vessel using a carrier gas. The vessel defines an interior volume segmented into an upper volume and a lower volume, the upper volume being in fluid communication with the lower volume, the lower volume containing substantially all of the precursor material and being separated from the upper volume by a separator. The vessel includes a diffuser tube that extends from an inlet port, through the separator and has a distal end having a plurality of openings formed therein and extends along the bottom interior wall of the vessel.

13 Claims, 8 Drawing Sheets

(56) References Cited

U.S. PATENT DOCUMENTS

| | | |
|---|---|---|
| 8,944,420 B2 | 2/2015 | Birtcher et al. |
| 2004/0084149 A1 | 5/2004 | Stamp et al. |
| 2008/0143002 A1 | 6/2008 | Steidl et al. |
| 2010/0230834 A1 | 9/2010 | Sakata et al. |
| 2010/0255198 A1 | 10/2010 | Cleary et al. |
| 2012/0266967 A1 | 10/2012 | Kanjolia et al. |
| 2013/0015594 A1 | 1/2013 | Birtcher et al. |
| 2013/0205611 A1* | 8/2013 | Wamura ............... F26B 19/00 34/60 |
| 2014/0072479 A1* | 3/2014 | Chu ..................... B01J 6/00 422/129 |
| 2016/0272193 A1 | 9/2016 | Kim |

FOREIGN PATENT DOCUMENTS

| | | |
|---|---|---|
| JP | 2012082527 A2 | 4/2012 |
| KR | 20150039222 A | 4/2015 |

\* cited by examiner

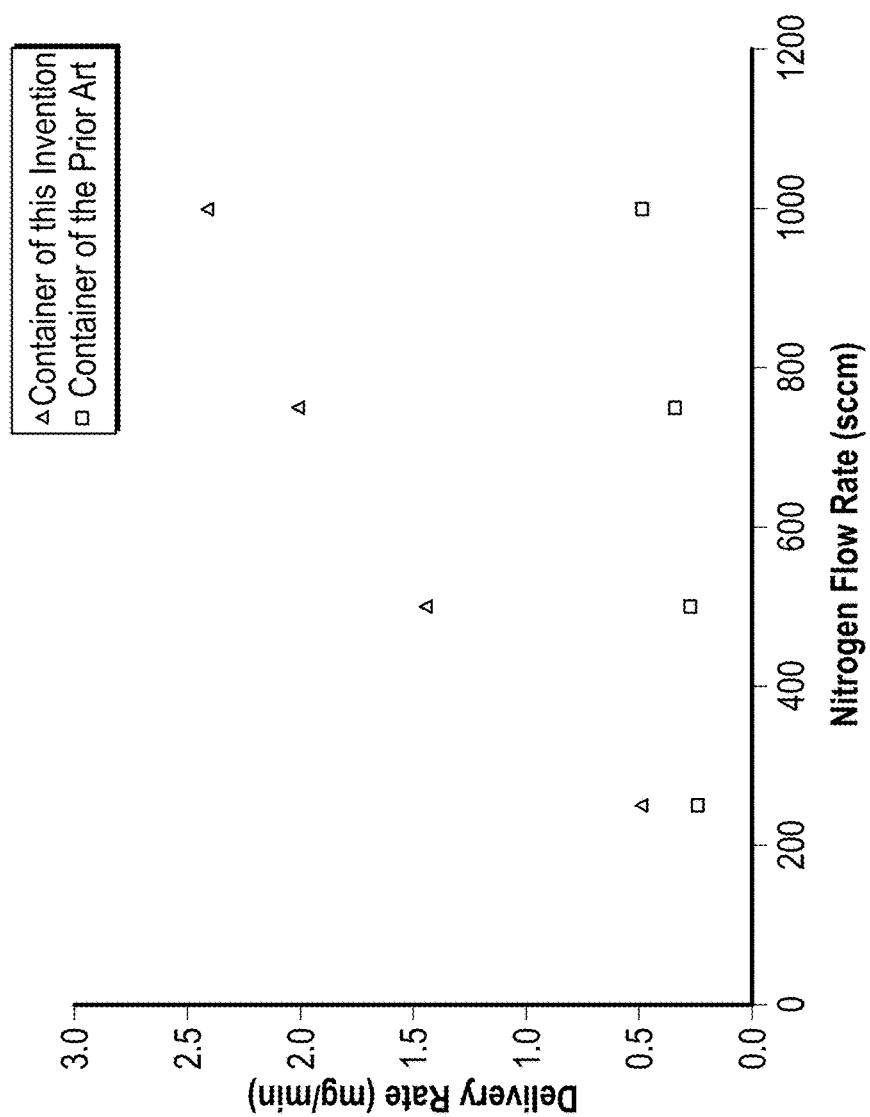

VESSEL AND METHOD FOR DELIVERY OF PRECURSOR MATERIALS

CROSS REFERENCE TO RELATED PATENT APPLICATIONS

The present patent application claims the benefit of U.S. Provisional Patent Application Ser. No. 62/149,548 filed Apr. 18, 2015.

BACKGROUND

The electronic device fabrication industry requires various chemicals as raw materials or precursors to fabricate integrated circuits and other electronic devices. Deposition processes such as, chemical vapor deposition (CVD) and atomic layer deposition (ALD) processes, are used in one or more steps during the manufacture of a semiconductor device to form one or more films or coatings on the surface of a substrate. In a typical CVD or ALD process, a precursor source that may be in a solid and/or liquid phase is conveyed to a reaction chamber having one of more substrates contained therein where the precursor reacts under certain conditions such as temperature or pressure to form the coating or film on the substrate surface.

There are several accepted technologies to supply a precursor vapor to a processing chamber. One process supplies the liquid precursor to a processing chamber in a liquid form with the flow rate controlled by a liquid mass flow controller (LMFC) and then the precursor is evaporated by a vaporizer at the point of use. A second process involves a liquid precursor being evaporated by heating and the resulting vapor is supplied to a chamber with the flow rate controlled by a mass flow controller (MFC). A third process involves bubbling a carrier gas upwardly through the liquid precursor. A fourth process involves enabling the carrier gas to flow over the surface of the precursor contained in a canister and carrying precursor vapor out of the canister and subsequently to the process tool. This fourth process, the delivery of chemical vapor from a solid precursor by sublimation, is the subject matter of the present invention.

One challenge associated with conventional vessels that deliver chemical vapor from a solid precursor by sublimation is a difficulty in obtaining high utilization of precursor. In other words—to minimize the amount of precursor left in the vessel when it is taken out of service to be cleaned and refilled. One cause of this problem is that, in conventional solid source vessels, the distance between the surface of the precursor and the inlet and outlets used to circulate the carrier gas, as well as the volume of the area in which the carrier gas contacts the precursor vapor, increases as the precursor is exhausted.

Attempts have been made to increase precursor utilization, including more uniform heating of the precursor chamber and improved carrier gas circulation. Although these efforts have resulted in improvements in precursor utilization, the structures needed to implement these improvements can make the vessels more difficult to clean and there is a need for further improvement in the precursor utilization.

BRIEF SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments, as described below and as defined by the claims which follow, comprise improvements to precursor utilization in vessels used to deliver a precursor-containing fluid stream to a deposition process, as well as simplifying the cleaning and refilling of such vessels. The disclosed embodiments satisfy the need in the art by providing at structure that allows a carrier gas to be delivered near the bottom of the vessel, flow upwardly through the precursor material, and pass through a filter disk before being transported out of the vessel. In addition, the vessel includes a shoulder portion that enables a service (fill) port to bypass the filter disk.

In addition, several specific aspects of the systems and methods of the present invention are outlined below.

Aspect 1: A vessel for conveying a precursor-containing fluid stream from a precursor material contained within the vessel using a carrier gas, the vessel comprising:

an interior volume segmented into an upper volume and a lower volume, the lower volume containing substantially all of the precursor material;

a lid that defines at least a portion of the upper volume;

a sidewall having an upper end comprising an upper lip and an upper opening, wherein at least a portion of the upper lip contacts the lid;

a base that defines a portion of the lower volume, the base including an interior bottom surface that defines a lower end of the lower volume, the interior bottom surface having an interior bottom surface shape;

a separator located at the upper end of the sidewall, interposed between the lid and the sidewall, and spanning the upper opening, the separator being formed of a porous material and having a first aperture formed therein;

an inlet that passes through the lid and is in fluid communication with the interior volume, the inlet having a body that extends from the lid to the separator, the body, the separator and the lid defining an outlet chamber that is external to the body, within the lid and above the separator;

a diffuser tube having a proximal end that is in fluid communication with the inlet and a distal end that is located with the lower volume, the distal end comprising a nozzle portion having a plurality of openings formed therein and a nozzle portion shape; and an outlet that passes through the lid and is in fluid communication with the interior volume, the outlet having at least one opening, each of the at least one opening being located within the outlet chamber;

wherein the separator and inlet are operationally configured to prevent flow communication from the lower volume into the outlet chamber except through the separator.

Aspect 2: The vessel of Aspect 1, wherein the porous material of the separator has a filtration efficiency of at least 90% for particles having a particle size of at least 0.7 μm.

Aspect 3: The vessel of any of Aspects 1-2, wherein the porous material of the separator has a filtration efficiency of at least 99.9% for particles having a particle size of at least 0.7 μm.

Aspect 4: The vessel of any of Aspects 1-3, further comprising a fill port that passes through the lid and terminates at a chute located along the sidewall within the lower volume, the fill port being in fluid communication with the interior volume and bypassing the separator.

Aspect 5: The vessel of Aspect 4, wherein the lower volume has a lower radius that is larger than an upper radius of the upper lip of the sidewall, thereby defining a shoulder portion of the sidewall.

Aspect 6: The vessel of Aspect 5, wherein the lower radius is at least 20% larger than the upper radius.

Aspect 7: The vessel of any of Aspects 5-6, wherein the chute is located in the shoulder portion.

Aspect 8: The vessel of any of Aspects 1-7, wherein the nozzle portion shape is substantially the same as the interior bottom surface shape.

Aspect 9: The vessel of any of Aspects 1-8, wherein the nozzle portion shape and the interior bottom surface shape are both concave.

Aspect 10: The vessel of any of Aspects 1-9, wherein the first aperture overlaps a centerline of the separator.

Aspect 11: The vessel of any of Aspects 1-10, wherein the inlet further comprises a coupler located below the separator, the diffuser tube attached to and detachable from the coupler.

Aspect 12: The vessel of any of Aspects 1-11, wherein the body further comprises a flange that is sized and positioned to form a seal between the flange and the separator, thereby preventing flow communication from the lower volume to the outlet chamber through the first aperture.

Aspect 13: A vessel for conveying a precursor-containing fluid stream from a solid precursor material contained within the vessel using a carrier gas, the vessel comprising:

a lid, a sidewall having an upper end that contacts the lid, and a base including an interior bottom surface, the lid, sidewall and base defining an interior volume, the interior bottom surface having a concave shape;

a fill port that passes through the lid and is in fluid communication with the interior volume;

an inlet that passes through the lid and is in fluid communication with the interior volume;

a diffuser tube that is in fluid communication with the inlet and is located in the interior volume, the diffuser includes a proximal end and a distal end, the distal end including a nozzle portion having a plurality of openings formed therein, the nozzle portion having a non-linear nozzle portion shape; and an outlet that passes through the lid and is in fluid communication with the interior volume, the outlet having at least one opening having a filter thereon.

Aspect 14: The vessel of Aspect 13, wherein the interior bottom surface has a partial spheroid shape.

Aspect 15: The vessel of any of Aspects 13-14, wherein the nozzle portion shape is complimentary in shape to a portion of the interior bottom surface located below the distal end.

Aspect 16: The vessel of any of Aspects 13-15, wherein the interior bottom surface and the sidewall meet at a lower shoulder and the nozzle portion is located below the lower shoulder.

Aspect 17: The vessel of any of Aspects 13-16, wherein the inlet further comprises a coupler located within the interior volume and attached to the proximal end of the diffuser tube.

Aspect 18: A method comprising:
 (a) providing the vessel of Aspect 1;
 (b) at least partially filling the lower volume with the precursor material;
 (c) supplying a carrier gas through a nozzle that is submerged in the precursor material at the commencement of step (c); and
 (d) removing a precursor-containing fluid stream from the outlet.

Aspect 19: The method of Aspect 18, further comprising:
 (e) assembling the lid, sidewall and base before performing any of steps (b) through (d);

wherein step (b) further comprises at least partially filling the lower volume with the precursor material using the fill port and without removing the lid from the sidewall.

Aspect 20: The method of any of Aspects 18-19, further comprising: (f) after performing steps (b) through (e), cleaning the lower volume without removing the lid from the sidewall.

Aspect 21: The method of any of Aspects 18-20, wherein step (b) further comprises:
 (b) at least partially filling the lower volume with the precursor material, the precursor material selected from the group of: hafnium chloride (HfCl4), zirconium chloride (ZrCl4), tantalum chloride (TaCl5), MoCl5, WCl6, WCl5, WOCl4, NbCl5, indium trichloride, aluminum trichloride, gallium trichloride, titanium iodide, tungsten hexacarbonyl, molybdenum hexacarbonyl, decaborane, precursors incorporating alkyl-amidinate ligands, precursors such as zirconium tertiary butoxide (Zr(t-OBu)4), tetrakis(diethylamino) zirconium (Zr(NEt2)4), tetrakis(diethylamino) hafnium (Hf(NEt2)4), tetrakis(dimethylamino) titanium (TDMAT), tert-butyliminotris(diethylamino) tantalum (TBTDET), pentakis (dimethylamino) tantalum (PDMAT), pentakis (ethylmethylamino) tantalum (PEMAT), tetrakis(dimethylamino)zirconium (Zr(NMe2)4), hafniumtertiarybutoxide (Hf(t-OBu)4), and mixtures thereof.

Aspect 22: The method of any of Aspects 18-21, wherein step (b) further comprises:
 (b) at least partially filling the lower volume with the precursor material, the precursor material selected from the group of: tantalum chloride and a mixture of tungsten hexachloride and tungsten pentachloride.

BRIEF DESCRIPTION OF THE DRAWING FIGURES

Embodiments of the claimed invention will hereinafter be described in conjunction with the appended drawing figures wherein like numerals denote like elements.

FIG. 10 is a graph showing the results of tests comparing the precursor delivery rate of the vessel of the present invention to that of a prior art vessel.

DETAILED DESCRIPTION OF THE PREFERRED EMBODIMENTS

Figure 1:
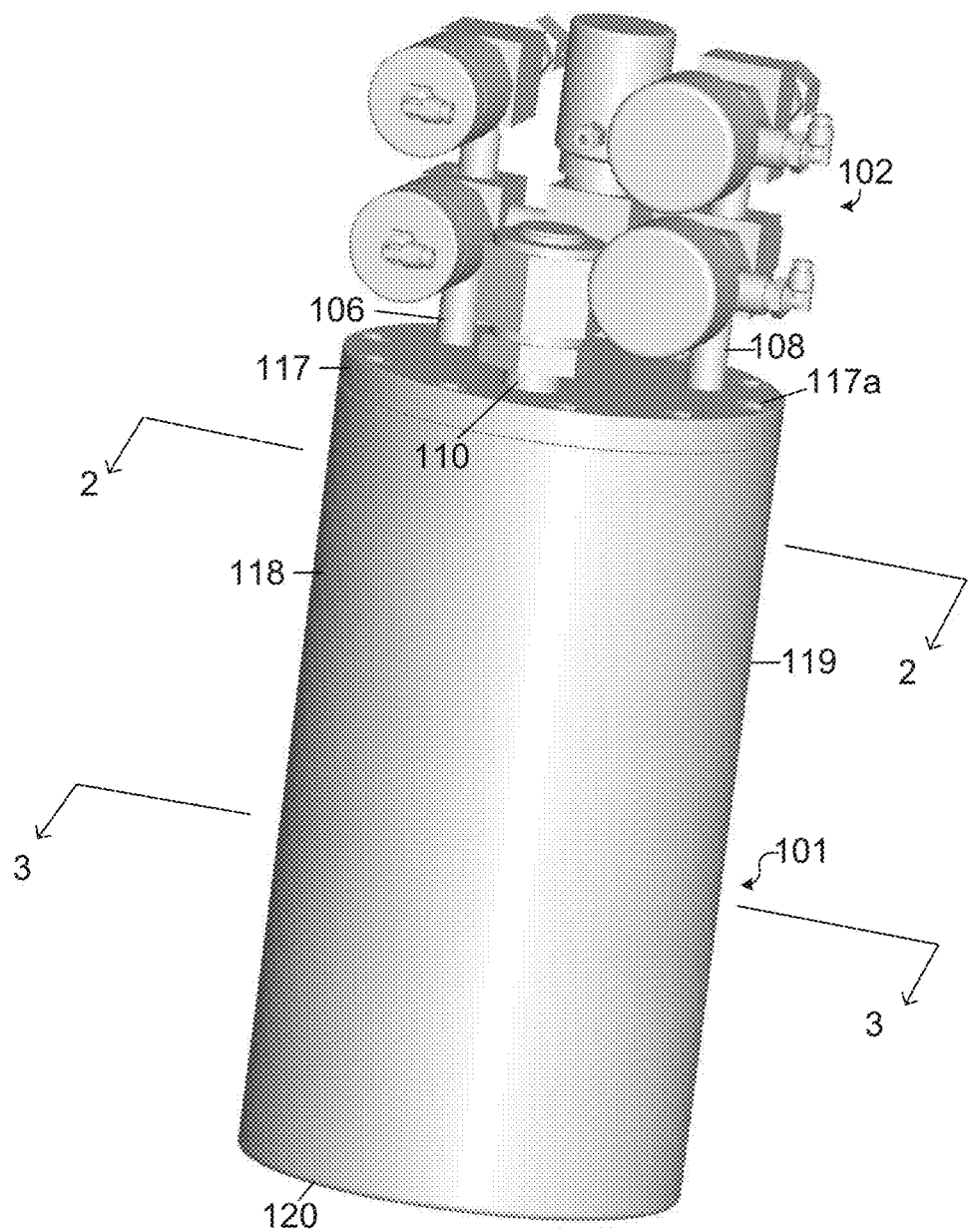
FIG. 1 is a side perspective view of a first embodiment of the vessel of the present invention.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

in the figures, elements that are similar to those of other embodiments of the present invention are represented by reference numerals increased by a value of 100. Such elements should be regarded as having the same function and features unless otherwise stated and/or depicted herein, and the discussion of such elements may therefore not be repeated for multiple embodiments. For example, the inlet port 106 in FIG. 1 corresponds to the inlet port 206 in FIG. 4.

The term "conduit," as used in the specification and claims, refers to one or more structures through which fluids can be transported between two or more components of a system. For example, conduits can include pipes, ducts, passageways, and combinations thereof that transport liquids, vapors, and/or gases.

The term "flow communication," as used in the specification and claims, refers to the nature of connectivity between two or more components that enables liquids, vapors, and/or gases to be transported between the components in a controlled fashion (i.e., without leakage). Coupling two or more components such that they are in flow communication with each other can involve any suitable method known in the art, such as with the use of welds, flanged conduits, gaskets, and bolts. Two or more components may also be coupled together via other components of the system that may separate them.

In order to aid in describing the invention, directional terms may be used in the specification and claims to describe portions of the present invention (e.g., upper, lower, left, right, etc.). These directional terms are merely intended to assist in describing and claiming the invention, and are not intended to limit the invention in any way. In addition, reference numerals that are introduced in the specification in association with a drawing figure may be repeated in one or more subsequent figures without additional description in the specification in order to provide context for other features.

A vessel for the vaporization of a precursor material, particularly a solid precursor, and a method comprising same are disclosed herein. The vessel is typically constructed of a vessel having a base, lid, and sidewall that define an interior volume to contain the precursor material. Upon application of heat, the precursor material may transform from a solid and/or liquid phase to its gaseous phase. The precursor material may be a solid and/or a liquid. Examples of precursor materials that may be used in the vessel include, but are not limited to, dimethyl hydrazine, hafnium chloride ($HfCl_4$), zirconium chloride ($ZrCl_4$), tantalum chloride ($TaCl_5$), $MoCl_5$, $WCl_6$, $WCl_5$, $WOCl_4$, $NbCl_5$, indium trichloride, aluminum trichloride, gallium trichloride, titanium iodide, tungsten hexacarbonyl, molybdenum hexacarbonyl, decaborane, precursors incorporating alkyl-amidinate ligands, precursors such as zirconium tertiary butoxide ($Zr(t-OBu)_4$), tetrakis(diethylamino) zirconium ($Zr(NEt_2)_4$), tetrakis(diethylamino) hafnium (Hf $(NEt_2)_4$), tetrakis(dimethylamino) titanium (TDMAT), tertbutyliminotris(diethylamino) tantalum (TBTDET), pentakis(dimethylamino) tantalum (PDMAT), pentakis (ethylmethylamino) tantalum (PEMAT), tetrakis(dimethylamino) zirconium ($Zr(NMe_2)_4$), and hafniumtertiarybutoxide ($Hf(t-OBu)_4$), and mixtures thereof.

In one embodiment, an inert carrier gas such as, for example, nitrogen, hydrogen, helium, argon, or other gas, is flowed through the interior volume and combines with the gaseous phase of the precursor material to provide a precursor-containing gaseous stream. In another embodiment, a vacuum may be used, alone or in conjunction with the inert gas, to withdraw the precursor-containing gaseous stream from the vessel. The precursor-containing gaseous stream may be then delivered to downstream production equipment, such as, for example, a reaction chamber for deposition. The vessel may provide for a continuous flow of precursor-containing gaseous stream while avoiding "cold spots" or other problems attributable to the condensation of vapors contained therein. The vessel may also provide a consistent and reproducible flow rate, which may be advantageous for a variety of manufacturing processes.

Referring to FIG. 1, vessel 101 has a lid portion 117, a base portion 118, inlet port 106, outlet port 108, and a service port 110 (also referred to herein as a fill port). Although vessel 101 is substantially cylindrical in shape, in this embodiment, having a single sidewall 119 and a substantially flat bottom exterior wall 120, it is understood that vessel 101 has other shapes, such as a hollow square or spherical shape.

Figure 2:
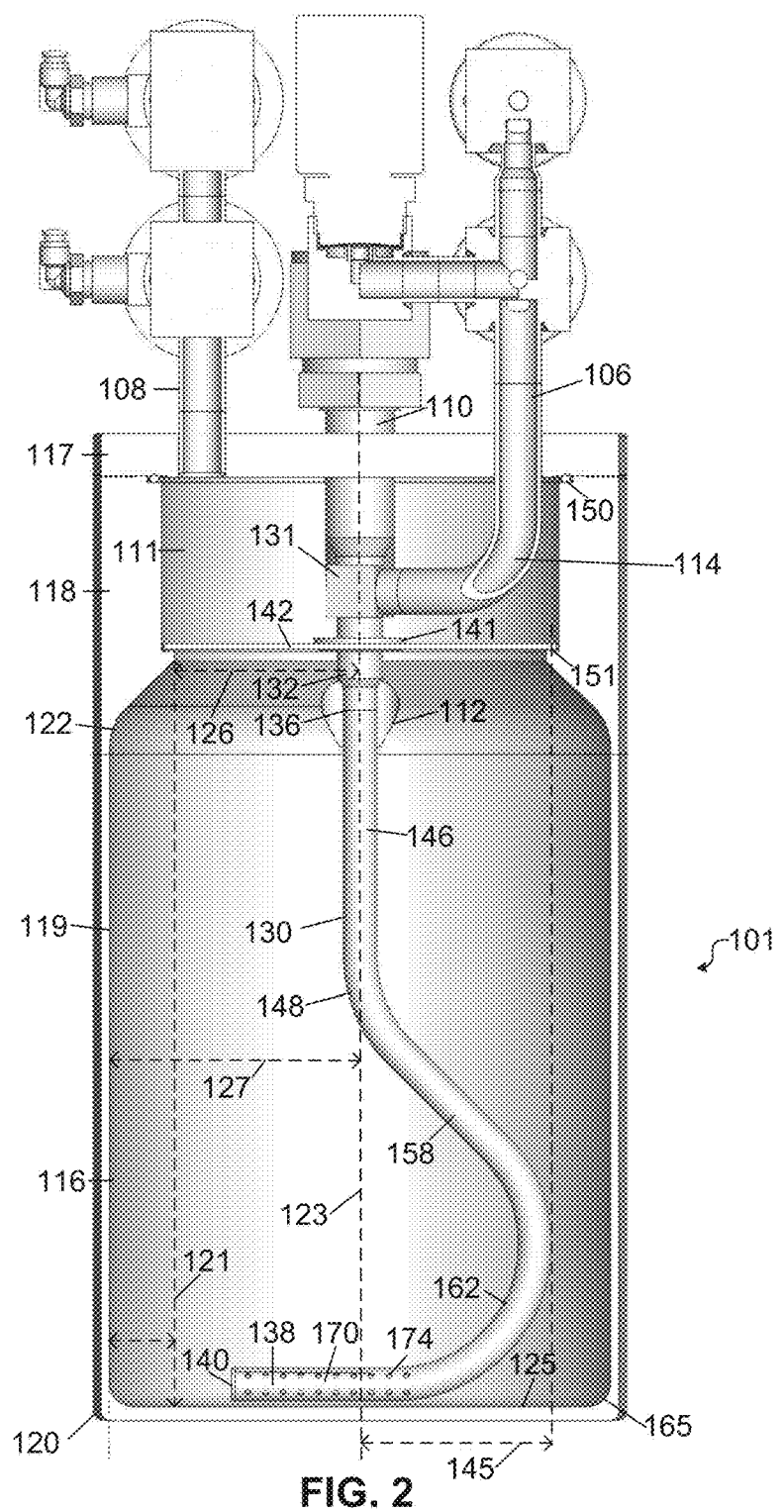
FIG. 2 is a sectional view, taken along line 2-2 of FIG. 1, of the first embodiment of the vessel of the present invention.

Referring to FIG. 2, the vessel 101 defines a precursor chamber 116 to contain the precursor material (not shown). Lid portion 117, base portion 118, and separator 142 may be constructed of a metal or other material that can withstand the operating temperatures of vessel 101. In certain embodiments, at least a portion of lid portion 117 and base portion 118 may be chemically non-reactive to the precursor material contained therein. In these or in alternative embodiments, at least a portion of lid portion 117, base portion 118, and sidewall 119 may be thermally conductive. Exemplary metals for lid portion 117, base portion 118, and sidewall 119 include stainless steel, nickel alloys (e.g., a Hastelloy®alloy, made by Haynes International, Inc.), titanium, chrome, zirconium, monel, impervious graphite, molybdenum, cobalt, anodized aluminum, aluminum alloys, silver, silver alloys, copper, copper alloys, lead, nickel clad steel, graphite, a ceramic material, doped or undoped, or combinations thereof. In one embodiment, at least a portion of the surface that contacts the precursor may be plated with various metals such as titanium, chrome, silver, tantalum, gold, platinum, titanium and other materials wherein the aforementioned plating materials can be doped or undoped to increase surface compatibility. In these embodiments, the plating material may be non-reactive to the precursor material contained therein.

In some embodiments, such as those depicted in FIGS. 1 and 2, inlet port 106 and outlet port 108 may include valves that act to control the flow of fluid into and out of vessel 101. Valves may be manual, automatic such as pneumatic, or the like and preferably are capable of operating at the operating temperatures of the vessel 101. In certain embodiments, valves may be fitted with disconnect fittings to facilitate removal of vessel 101 from the process line. Brackets (not shown) to minimize the bending of the inlet port 106 and outlet port 108 tubing may support valves. Further, the inlet and outlet tubing may be connected with a standard gas tight fitting, such as a VCR™ fitting manufactured by the Swagelok Company of Cleveland, Ohio, that is used to connect two separate pieces of piping. In some embodiments, the outlet port 108 may have one or more filters that are placed in-line on the outlet tubing to remove any impurities or particulate matter from the precursor-containing fluid stream. Filters may be comprised of a porous material (not shown) that is chemically unreactive to the precursor-containing fluid stream and of sufficient particle size to capture any impurities or particulate matter in the precursor-containing fluid stream as it passes therethrough.

The vessel 101 may further comprise a thermally conductive jacket that surrounds at least a portion of vessel 101 and is retained by fasteners fitted in recesses, such as bolt and nut combinations to provide a snug fit. A thermally conductive jacket may allow for the uniform distribution of heat and improve the conduction of heat into the precursor material contained within the interior volume of the vessel 101. The jacket and fasteners may be comprised of a different material that allows for the expansion of the jacket upon heating. For example, the jacket may be comprised of aluminum whereas the sidewall 119 of vessel 101 may be comprised of stainless steel.

Vessel 101 and the precursor material contained therein are preferably heated to a temperature at which the vapor pressure from precursor sublimation is at least 2 Torr (0.27 kPa) and, more preferably, at least 10 Torr (1.33 kPa). Heating can be accomplished through a variety of means that include, but are not limited to, strip heaters, radiant heaters, circulating fluid heaters, resistant heating systems, inductive heating systems, or other means that can be used alone or in combination. These heating sources may be external and/or internal in relation to vessel 101. In some embodiments, the entire vessel 101 may be introduced into an oven or a water bath. In other embodiments, base portion 118 may have one or more heating elements of cartridges contained therein (not shown). Heating cartridges may be inserted into the interior volume of vessel 101 in various places. Still other embodiments may employ one or more inductive heating coils operated by an RF power supply. Yet other embodiments may employ a heater that is in fluid communication with the carrier gas supply that heats the carrier gas to a certain temperature prior to introduction into vessel 101.

Vessel 101 may further have one or more thermocouples, thermistors, or other temperature sensitive devices that can monitor the temperature of vessel 101 and the precursor material contained therein. The one or more thermocouples may be located in the base portion 118, lid portion 117, precursor chamber 116 and/or other areas of the vessel. The one or more thermocouples or other temperature sensitive devices may be connected to a controller or computer that is in electrical communication with the heating source to maintain a uniform temperature within the precursor chamber 116 of the vessel and the chemical contained therein.

Referring to FIG. 2, the vessel 101 comprises a base portion 118 and a lid portion 117. Lid portion 117 may be fastened onto the base portion 118 through the one or more fasteners 117a such as screws or pins (see FIG. 1). The surface between the lid portion 117 and the base portion 118 may be sealed by a seal 150 to form an air tight seal. Seal 150 may be a seal, o-ring, gasket, insert or the like which may be used to allow vessel 101 to maintain a vacuum or sustained pressure and may be constructed of a metal or a polymeric material. Alternatively, lid portion 117 and/or base portion 118 may be aligned or welded onto sidewall 119 to form an airtight or pressure-tight seal without the need for seal 150.

Inlet port 106 extends through the lid portion 117, turns via inlet bend 114, and connects to a body 131. The body 131 directs the carrier gas through the separator 142. The body 131 comprises a flange 141 that forms a seal against the separator 142 via friction fit.

The body 131 further comprises a coupling 132 that extends below the separator 142. The body 131 extends through a hole or aperture 149 in the center of the separator 142 and the diffuser tube 130 is connected to the coupling 132 at a joint 136, which is near the top of the precursor chamber 116. The diffuser tube 130 has a linear upper portion 146 that extends downwardly into the precursor chamber 116 from a point near centerline 123 of vessel 101, a bend 148 that curves outwardly toward the sidewall 119, a second linear portion 158, and a reverse curve 162 that curves back toward the centerline 123, and then extends parallel to an interior bottom surface 125 of a bottom wall 120 of the vessel 101.

At the end 140 of the diffuser tube 130, a nozzle 138 comprises a plurality of nozzle openings (holes) 174 through which the carrier gas enters the precursor chamber 116. In this embodiment, the nozzle openings 174 are preferably between 0.001 inches (0.0025 cm) and 0.25 inches (0.64 cm) in diameter and approximately 40 nozzle openings are located in the portion of the diffuser tube 130 that extends parallel to the interior bottom surface 125 of the vessel 101.

Nozzle openings 174 are preferably distributed evenly across the interior bottom surface 125 of the vessel 101 to enable the best precursor utilization. Preferably the nozzle openings 174 are located along the sides of the nozzle 138 (only one side 170 is visible in the figures) to direct carrier gas flow into as broad a swath of the precursor as possible so that the distributor does not quickly become uncovered with a premature sublimation of the precursor directly above the diffuser tube 130. Once the diffuser tube 130 is uncovered, the saturation of vapor in the carrier will quickly diminish and the mass flow drop will cause a process shutdown to replace the vessel 101 with another full vessel. Accordingly, in order to extend the life of the vessel 101 and to increase precursor utilization, the nozzle openings 174 are preferably spaced equally along the portion of the diffuser tube 130 in which the openings 174 are located and the openings are preferably located in the bottom half section of the diffuser tube 130 (i.e., below the centerline of the diffuser tube 130).

As an alternative to providing the plurality of nozzle openings 174, the portion of the diffuser tube 130 on which the plurality of nozzle openings 174 is located could be replaced with a metal sintered frit welded or bonded to the end of the diffuser tube 130. One example of a suitable frit is a model 316L, Series 1200 porous stainless steel cup, made by the Mott Corporation. One benefit of using a frit (filter) instead of the nozzle openings 174 is that the frit performs a filtration function and prevents precursor material from being sucked into the diffuser tube 130 or any conduits upstream from the diffuser tube 130. It is not uncommon for the diffuser tube 130 to briefly pull a vacuum during the startup of the system of which the vessel 101 is a component.

The carrier gas exits through the openings 174 in the nozzle 138 of the diffuser tube 130 and migrates up through a bed of solid precursor particles (not shown). As the carrier gas diffuses up through the precursor, it mixes with sublimated precursor and passes through the separator (filter disk) 142 prior to exiting the vessel 101 through the outlet port 108.

Figure 3:
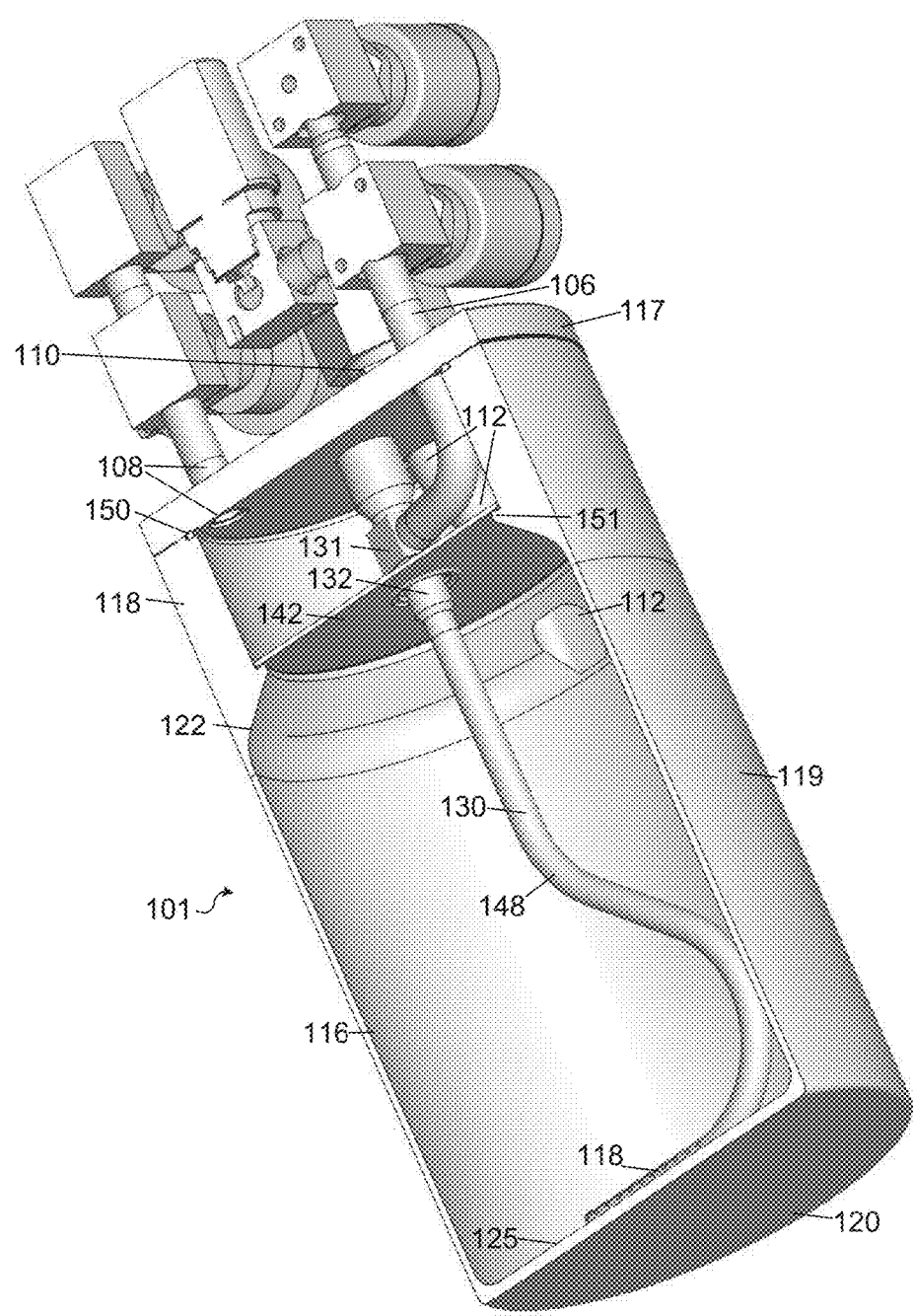
FIG. 3 is a perspective side sectional view, taken along line 3-3 of FIG. 1, of the first embodiment of the vessel of the present invention.

In the first embodiment, separator 142 is provided to prevent unsublimated precursor from mixing with the outgoing precursor-containing fluid stream. FIGS. 2 and 3 provide an illustration of separator 142 that rests on upper lip 151 of the base portion 118 and acts to partition the interior volume of the vessel 101 into upper volume 111 (also referred to as an outlet or an inlet chamber) and a lower volume 116 (also referred to as a precursor chamber). Separator 142 defines the dividing line between the upper volume 111 and the lower volume 116.

The separator can be any planar separator as described above, but one embodiment could be a 3.9 inch (9.91 cm) diameter 316L stainless steel filter disk fabricated from porous sheet material having a thickness of 0.047 inches (0.12 cm), and having 99.9% efficiency for particles of 0.7 µM size, 99.0% efficiency for particles of 0.35 µM and 90% efficiency for all particle sizes, and with a bubble point of 2.0-2.5 Hg.

Depending upon the precursor, there may be a need to stop the entrainment of solid in the outgoing precursor-containing fluid stream. In these embodiments, vessel 101 may further include an optional stainless steel filter 239 or frit (see FIG. 4), which may prevent unsublimated precursor from entering the outgoing precursor-containing fluid stream. The optional stainless steel frit may have a pore size that ranges from 0.1 to 100 microns. The optional frit can be installed in the upper volume 111 and/or the fluid path of the outgoing precursor-containing fluid. In some embodiments, a filter is installed on the outlet port 108 (see, e.g., filter 239 is installed on the outlet port 208 in FIG. 4).

Operating temperatures of the vessel 101 may vary depending upon the precursor material contained therein but may generally range from about 25 degrees Celsius to about 500 degrees Celsius, or from about 100 degrees Celsius to about 300 degrees Celsius. Operating pressure of the vessel may range from about 2 Torr to about 1,000 Torr, or from about 0.1 Torr to about 200 Torr. In many applications, a pressure range of 10 to 200 Torr is preferable.

In one embodiment, the method of using the vessel 101 includes introducing a precursor material, such as a solid precursor material, through service port 110 and into the precursor chamber 116 of vessel 101. It is preferable that the precursor material is filled to the point where it is in continuous contact with at least a portion of the diffuser tube 130. More preferably, the precursor covers the nozzle 138 of the diffuser tube 130. The lid portion 117 and base portion 118 are fastened to provide a pressure-tight or airtight seal 150.

A heating source, such as heating cartridges, is used to bring the precursor material to sublimation temperature and form a precursor gas. The inert carrier gas enters through inlet port 106, travels through the diffuser tube 130, and combines with the precursor gas to form the precursor-containing fluid stream. The precursor-containing fluid stream passes through separator 142 and outlet port 108 and through in-line filters (not shown) to a down-stream production device such as a reaction chamber used for thin film deposition.

It is beneficial to build, clean, purge, dry, and leak check the vessel 101 first. Then the solid precursor particles are loaded through the service port 110 via gravity. The service port 110 is located on the lid portion 117 and the service port chute extends down into the precursor chamber at the shoulder 122 of the vessel 101, which is below and outside the perimeter of the separator 142. This allows for filling of the precursor and cleaning or otherwise servicing or inspecting the vessel 101 without having to remove the lid portion 117 and disassemble the body 131, separator 142, and diffuser tube 130.

The precursor chamber 116 has a lower radius 127 that is preferably at least 10% larger (more preferably, at least 20% larger) than the upper radius 126, near the separator 142. This difference allows the shoulder 122 to be thick enough to have a service port chute 112, which bypasses the separator 142 and is aligned with the service port 110, framed therein.

Figure 4:
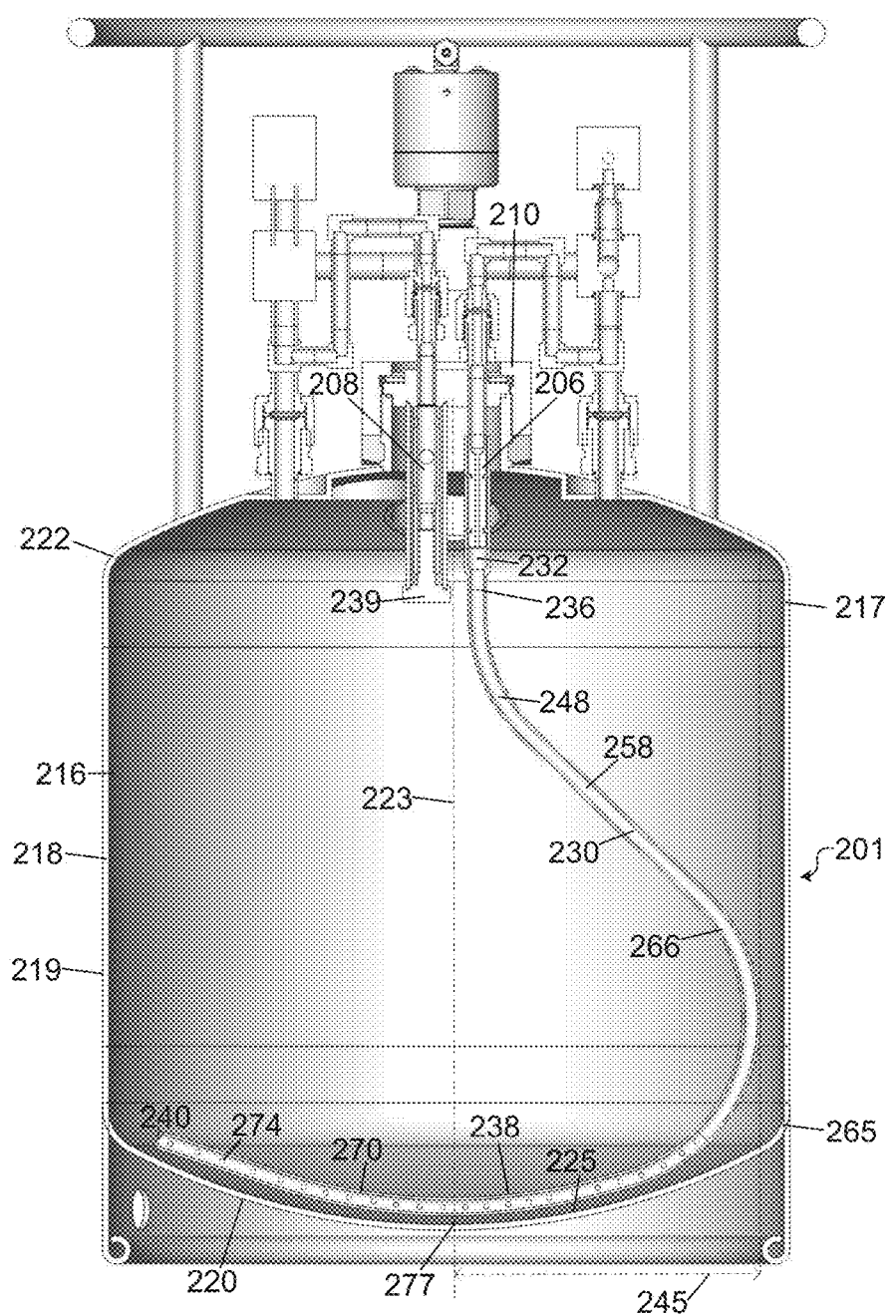
FIG. 4 is a side sectional view of a second embodiment of the vessel of the present invention.

FIG. 4 shows a side sectional view of a second embodiment of the vessel 201, which is a bulk container for solid-source precursor. In this embodiment, the bottom wall 220 of the vessel 201 has a curved interior bottom surface 225. The sidewall 219 of the vessel 201 meets the curved interior bottom surface 225 at the bottom shoulder 265. In this embodiment, the interior bottom surface 225 has the shape of a partial sphere. This shape enables the walls 219 of the vessel 201 to be thinner (and therefore, lighter) than if the interior bottom surface 225 were substantially planar. Benefits of a non-planar interior bottom surface 225 could also be achieved with other curved shapes, such as partial spheroid shapes. As used in the specification and claims, a partial spheroid shaped surface is intended to refer to both partial spheroid and partial sphere shapes.

In the embodiment, the diffuser tube 230 is mounted near the centerline 223 of the vessel 201 and it extends downward toward the interior bottom surface 225 of the vessel 201. The diffuser tube 230 follows an upper bend 248 and a middle straight portion 258 extends toward the sidewall 219 of the vessel 201 and follows a lower bend 262 downward along the interior bottom surface 225 of the vessel 201. The nozzle 238 of the diffuser tube follows the curvature of the interior bottom surface 225 of the vessel 201. The plurality of openings 274 on the nozzle 238 are below the bottom shoulder 265 of vessel 201. The nozzle 238 extends along the lowest point 277 of the interior bottom surface 225 of the vessel 201. This results in a high utilization of precursor, meaning that a low percentage of precursor is left behind in the vessel 201.

In this embodiment, it is desirable for the nozzle 238 (also referred to as the distal end) of the diffuser tube 230 to follow the shape of the portion of the interior bottom surface 225 that is below the nozzle 238. Accordingly, in this embodiment, the nozzle 238 has an arcuate shape.

The vessel 201 has a larger internal volume than the first embodiment. As this embodiment does not have a disk separator (see 142 of FIGS. 2-3) that defines a lower volume and an upper volume, the entire inner volume of the vessel 201 is the precursor volume 216.

Figure 5:
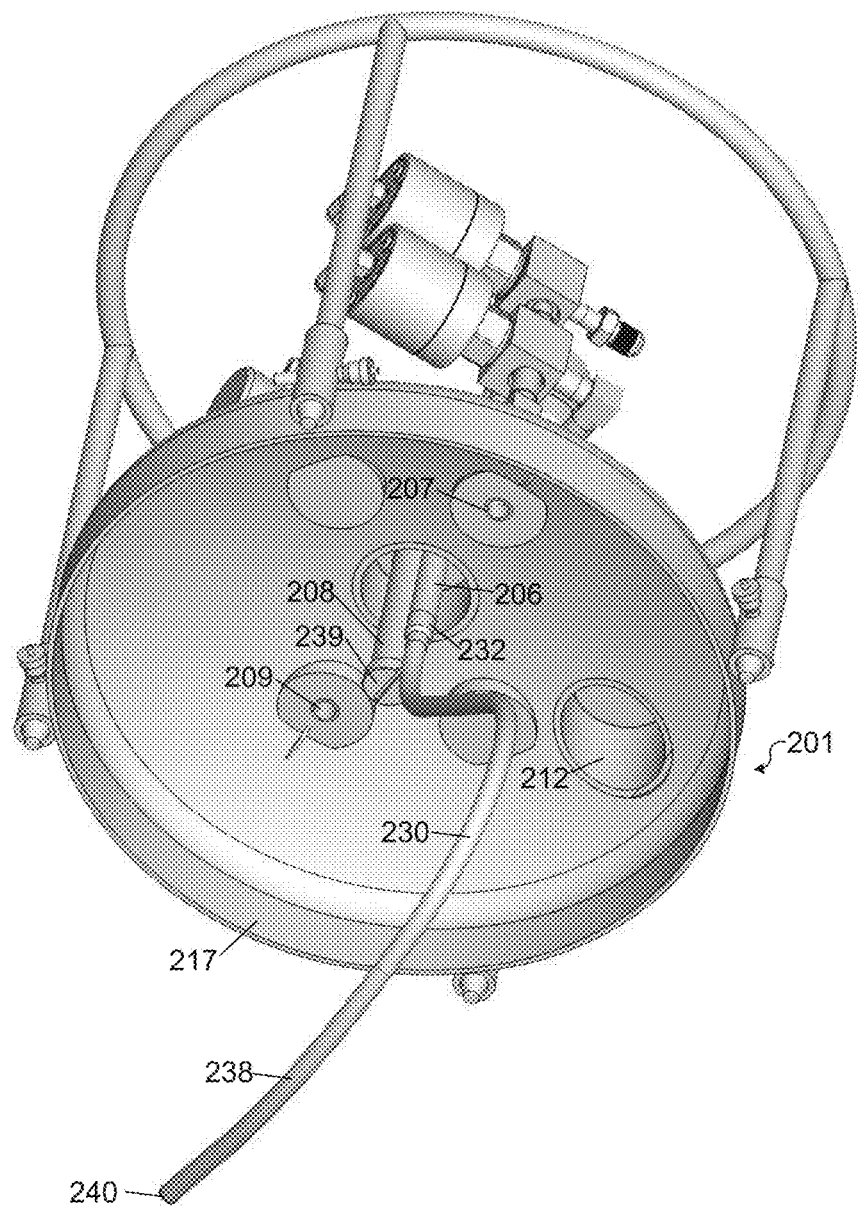
FIG. 5 is a partial perspective view the second embodiment of the vessel of the present invention, shown without the base portion and viewed from the bottom.

FIG. 5 shows a bottom perspective view of the lid portion 217 of a second embodiment of the vessel 201. The inlet port 206 extends through the lid portion 217 and is connected to the diffuser tube 230 by a coupling 232. The outlet port 208 comprises a filter 239 and extends through the lid portion 217. The service port chute 212 extends through the lid portion 217, allowing for precursor fills without removing the lid or disconnecting any inlet or outlet piping. In this embodiment, ports 207 and 209 are plugged and are used for the attachment of additional structural support to the valve assembly.

Figures 6, 7:
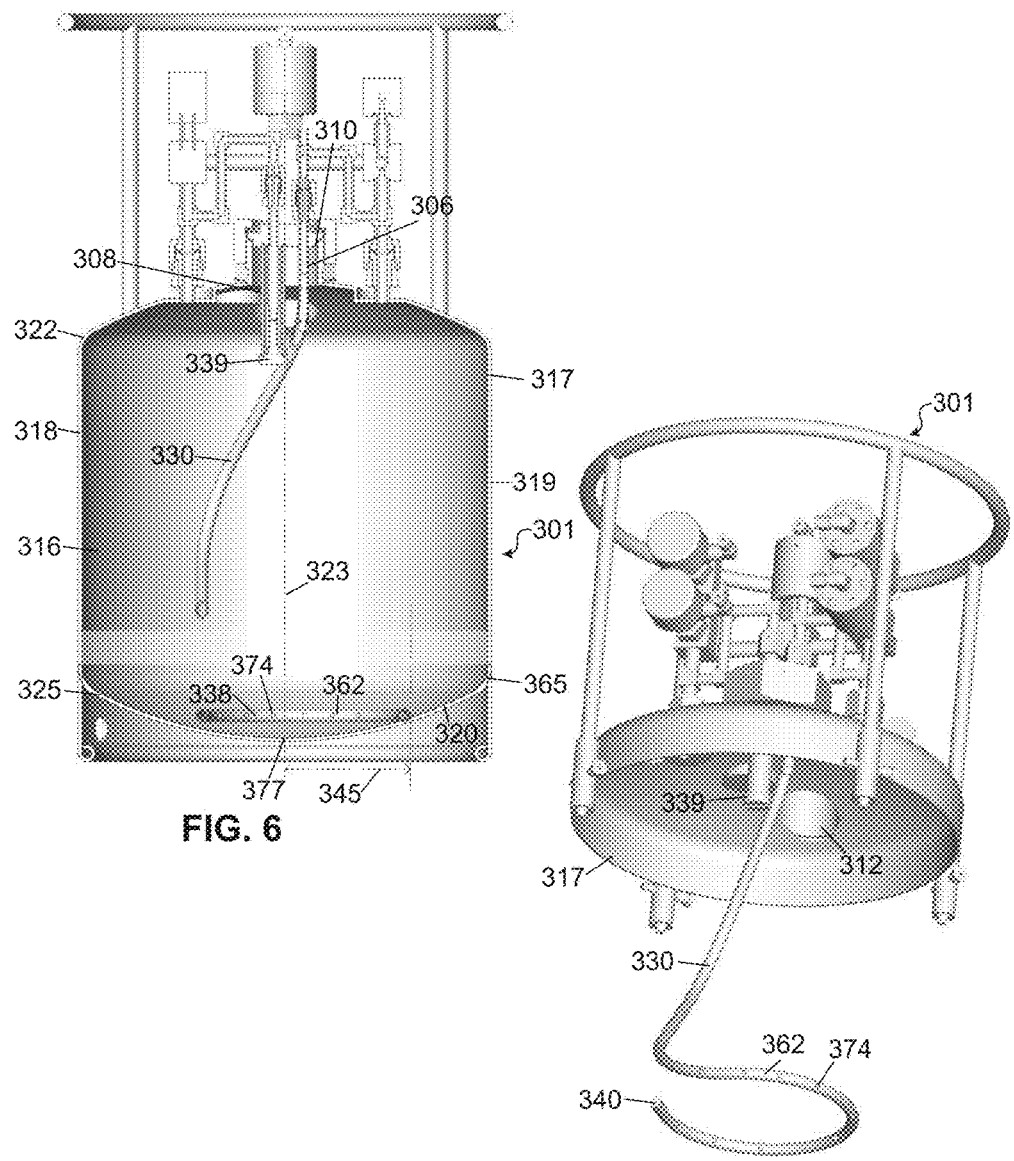
FIG. 6 is a side sectional view of a third embodiment a vessel of the present invention.
FIG. 7 is a partial perspective view of the third embodiment of the vessel of the present invention, shown without the base portion and viewed from the bottom.

FIGS. 6 and 7 show a side sectional view and bottom perspective view, respectively, of a third embodiment of the vessel 301. In this embodiment, the diffuser tube 330 curves away from the centerline 323 of the vessel 301 and extends toward the interior bottom surface 325 forming a bottom curved portion 362. The bottom curved portion 362 is substantially horizontal and ring shaped and sits below the bottom shoulder 365 of the vessel 301.

Figure 8:
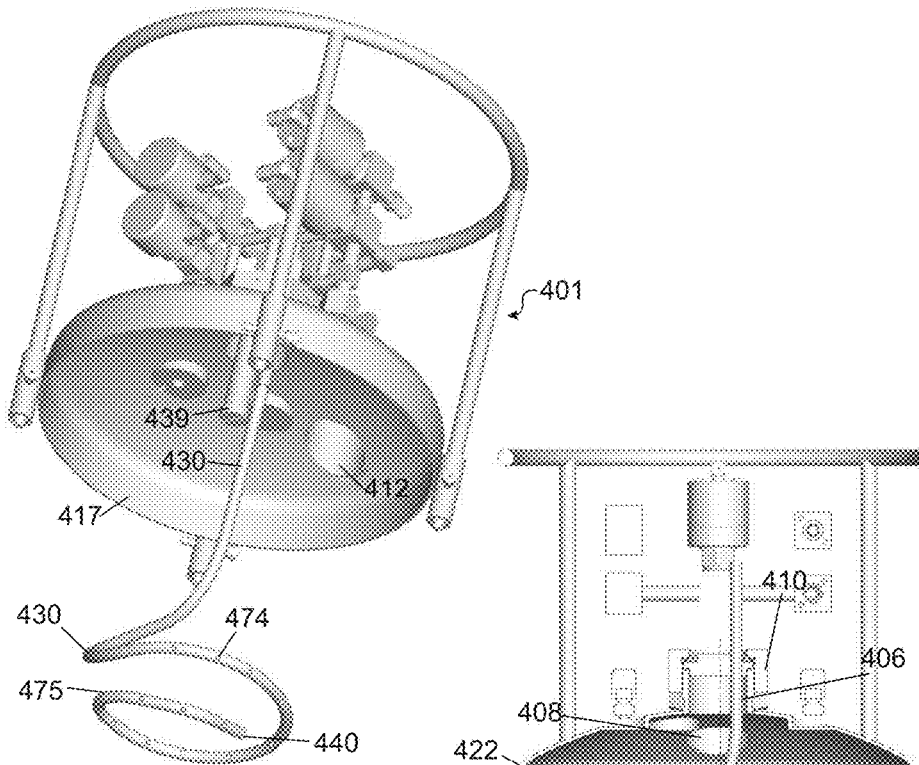
FIG. 8 is a partial perspective view of a fourth embodiment of the vessel of the present invention, shown without the base portion and viewed from the bottom.
Figure 9:
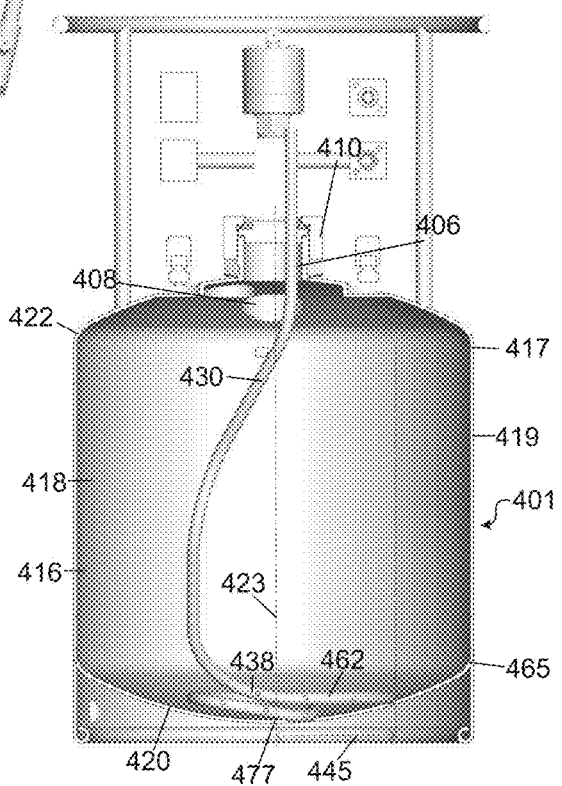
FIG. 9 is a side sectional view of the fourth embodiment of the vessel of the present invention.

FIGS. 8 and 9 show a bottom perspective view of the lid portion 417 and a side sectional view, respectively, of a fourth embodiment of the vessel 401. The diffuser tube 430 curves away from the centerline 423 of the vessel 401 and extends down toward the interior bottom surface of the vessel 401 forming a substantially horizontal ring with a secondary nozzle bend 475 that overlaps the generally horizontal portion. The entire nozzle 438 of the diffuser tube 440 sits below the bottom shoulder 465 of the vessel 401. The secondary nozzle bend 475 extends along the lowest point 477 of the interior bottom surface of the vessel 401. This results in a high utilization of precursor which lowers production costs and reduces the equipment downtime associated with replacing the vessel 401 with a vessel 401 filled with precursor.

EXAMPLE

In order to demonstrate the advantages of the present invention, two tests were performed. Test 1 was performed using the vessel 101 shown in FIGS. 1-4, which includes on the curved diffuser tube 130 having a plurality of the nozzle openings 174 (see, e.g., FIG. 2). Test 2 was performed using the prior art vessel described in U.S. Pat. No. 9,109,287, which is hereby incorporated by reference as if fully set forth. The prior art vessel has an inlet port that terminates above the separator 142 (i.e., the diffuser tube 130 is not provided), but is otherwise identical to the vessel 101 shown in FIGS. 1-4. This results in carrier gas being introduced into the lower portion of the container only above the separator 142.

Both of the tests were performed by introducing one kilogram of solid precursor tantalum chloride (TaCl5) into the vessel, then placing the vessel in an oven heated to 90 degrees Celsius on an aluminum plate maintained at 80 degrees Celsius. This temperature gradient was maintained to avoid solid condensation on the separator 142. During the tests, downstream pressure was maintained at 100 torr and a nitrogen carrier gas was pulsed at 10 second intervals, alternating between a bypass and the inlet port 106. The test was repeated on each vessel at four different carrier gas flow rates, 250, 500, 750, and 1000 standard cubic centimeters per minute (sccm).

Delivery rates of tantalum chloride precursor for both vessels were measured. measured using a Piezocon gas concentration sensor and the data is shown in FIG. 10. As shown in FIG. 10, the vessel 101 of present invention provided up to six times higher delivery rates of tantalum chloride than the vessel of the prior art.

While the principles of the claimed invention have been described above in connection with preferred embodiments, it is to be clearly understood that this description is made only by way of example and not as a limitation of the scope of the claimed invention.

The invention claimed is:

1. A vessel for conveying a precursor-containing fluid stream from a precursor material contained within the vessel using a carrier gas, the vessel consisting essentially of:
   an interior volume segmented into an upper volume and a lower volume, the lower volume containing all of the precursor material;
   a lid that defines at least a portion of the upper volume;
   a sidewall having an upper end comprising an upper lip and an upper opening, wherein at least a portion of the upper end contacts the lid;
   a base that defines a portion of the lower volume, the base including an interior bottom surface that defines a lower end of the lower volume, the interior bottom surface having an interior bottom surface shape;
   a separator located at the upper end of the sidewall, interposed between the lid and the sidewall, and spanning the upper opening, the separator being formed of a porous material and having a first aperture formed therein;
   an inlet that passes through the lid and is in fluid communication with the interior volume, the inlet having a body that extends from the lid to the separator: the body, the separator and the lid defining an outlet chamber that is external to the body, within the lid and above the separator;
   a diffuser tube having a proximal end that is in fluid communication with the inlet and a distal end that is located with the lower volume, the distal end comprising a nozzle portion having a plurality of openings formed therein and a nozzle portion shape;
   an outlet that passes through the lid and is in fluid communication with the interior volume, the outlet having at least one opening, each of the at least one opening being located within the outlet chamber;
   a fill port that passes through the lid and terminates at a chute located along the sidewall within the lower volume, the fill port being in fluid communication with the interior volume and bypassing the separator; and
   the inlet further comprises a coupler located below the separator, the diffuser tube attached to and detachable from the coupler;
   wherein
   the interior bottom surface contains at least part of bottom surface of the vessel; and
   the separator and inlet are operationally configured to prevent flow communication from the lower volume into the outlet chamber except through the separator.

2. The vessel of claim 1, wherein the porous material of the separator has a filtration efficiency of at least 90% for particles having a particle size of at least 0.7 µm.

3. The vessel of claim 1, wherein the lower volume has a lower radius that is larger than an upper radius of the upper lip of the sidewall, thereby defining a shoulder portion of the sidewall.

4. The vessel of claim 3, wherein the lower radius is at least 20% larger than the upper radius.

5. The vessel of claim 3, wherein the chute is located in the shoulder portion.

6. The vessel of claim 1, wherein the nozzle portion shape is substantially the same as the interior bottom surface shape.

7. The vessel of claim 1, wherein the nozzle portion shape and the interior bottom surface shape are both concave.

8. The vessel of claim 1, wherein the body further comprises a flange.

9. A method comprising:
   (a) providing the vessel of claim 1;
   (b) at least partially filling the lower volume with the precursor material collectively from the interior bottom surface up and covering at least part of the nozzle portion of the diffuser tube with the precursor material;
   (c) supplying the carrier gas through the nozzle and diffusing the carrier gas up through the precursor material directly; and
   (d) removing a precursor-containing fluid stream from the outlet.

10. The method of claim 9, further comprising:
    (e) assembling the lid, sidewall and base before performing any of steps (b) through (d);

wherein step (b) further comprises at least partially filling the lower volume with the precursor material using the fill port and without removing the lid from the sidewall.

11. The method of claim 10, further comprising:
(f) after performing steps (b) through (e), cleaning the lower volume without removing the lid from the sidewall.

12. The method of claim 9, wherein step (b) further comprises:
(b) at least partially filling the lower volume with the precursor material, the precursor material selected from the group of: hafnium chloride (HfCl4), zirconium chloride (ZrCl4), tantalum chloride (TaCl5), MoCl5, WCl6, WCl5, WOCl4, NbCl5, indium trichloride, aluminum trichloride, gallium trichloride, titanium iodide, tungsten hexacarbonyl, molybdenum hexacarbonyl, decaborane, precursors incorporating alkyl-amidinate ligands, precursors such as zirconium tertiary butoxide (Zr(t-OBu)4), tetrakis(diethylamino)zirconium (Zr(Net2)4), tetrakis(diethylamino)hafnium (Hf(Net2)4), tetrakis(dimethylamino)titanium (TDMAT), tertbutyliminotris(diethylamino)tantalum (TBTDET), pentakis (dimethylamino)tantalum (PDMAT), pentakis (ethylmethylamino)tantalum (PEMAT), tetrakis (dimethylamino)zirconium (Zr(NMe2)4), hafniumtertiarybutoxide (Hf(t-OBu)4), and mixtures thereof.

13. The method of claim 9, wherein step (b) further comprises:
(b) at least partially filling the lower volume with the precursor material, the precursor material selected from the group of: tantalum chloride and a mixture of tungsten hexachloride and tungsten pentachloride.

* * * * *